US007683476B2

(12) United States Patent
Lee et al.

(10) Patent No.: US 7,683,476 B2
(45) Date of Patent: Mar. 23, 2010

(54) SEMICONDUCTOR PACKAGE FILM HAVING REINFORCING MEMBER AND RELATED DISPLAY MODULE (75) Inventors: Si-hoon Lee, Yongin-si (KR); Jae-cheon Doh, Cheonan-si (KR); Sa-yoon Kang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 286 days.

(21) Appl. No.: 11/517,253

(22) Filed: Sep. 8, 2006

(65) Prior Publication Data

US 2007/0057360 A1 Mar. 15, 2007

(30) Foreign Application Priority Data

Sep. 9, 2005 (KR) ............... 10-2005-0084304

(51) Int. Cl.
*H01L 23/34* (2006.01)
(52) U.S. Cl. ............... 257/723; 257/E23.042
(58) Field of Classification Search ............... 257/735, 257/701, 723, 724, 729, 685, E23.042; 438/110; 174/254, 260, 261; 361/748; 349/150
See application file for complete search history.

(56) References Cited

U.S. PATENT DOCUMENTS 6,744,120 B1 * 6/2004 Yanagisawa ............... 257/668
7,029,954 B2 * 4/2006 Grigg ........................ 438/127

FOREIGN PATENT DOCUMENTS

| JP | 2001-053108 | 2/2001 |
| KR | 1019960062638 | 12/1996 |
| KR | 1020000038523 | 7/2000 |
| KR | 1020030054883 | 7/2003 |
| KR | 1020040010101 A | 1/2004 |

* cited by examiner

*Primary Examiner*—David A Zarneke
*Assistant Examiner*—Jenny L Wagner
(74) *Attorney, Agent, or Firm*—Volentine & Whitt, PLLC (57) ABSTRACT Semiconductor package films and a display module comprising a packaged semiconductor device punched from a semiconductor package film are provided. In one embodiment, the invention provides a semiconductor package film comprising a base film comprising a plurality of semiconductor device regions, an intermediate region disposed on a first surface of the base film and disposed between two semiconductor device regions, and a reinforcing member attached to a second surface of the base film opposite the first surface of the base film and attached opposite the intermediate region. Each semiconductor device region comprises a semiconductor mounting region adapted to receive a semiconductor chip, and first and second metal line regions.

6 Claims, 8 Drawing Sheets

SEMICONDUCTOR PACKAGE FILM HAVING REINFORCING MEMBER AND RELATED DISPLAY MODULE

BACKGROUND OF THE INVENTION

1. Field of the Invention

Embodiments of the invention relate to a semiconductor package film and a related display module. In particular, embodiments of the invention relate to a semiconductor package film comprising a reinforcing member and a display module comprising a packaged semiconductor device punched from a semiconductor package film.

This application claims priority to Korean Patent Application No. 10-2005-0084304, filed on Sep. 9, 2005, the subject matter of which is hereby incorporated by reference in its entirety.

2. Description of Related Art

As part of the continual effort to reduce the size of electronic devices, efforts are being made to reduce the thickness of semiconductor packages. As semiconductor package thickness is reduced, the semiconductor packages used in electronic devices become smaller and lighter. Tape carrier packages (TCPs) and chip-on-films (COFs) are examples of small and light semiconductor packages. TCPs and COFs are fabricated using a semiconductor package film, and are mainly used in display apparatuses such as liquid crystal displays (LCDs) or plasma display panels (PDPs).

Figure 1:
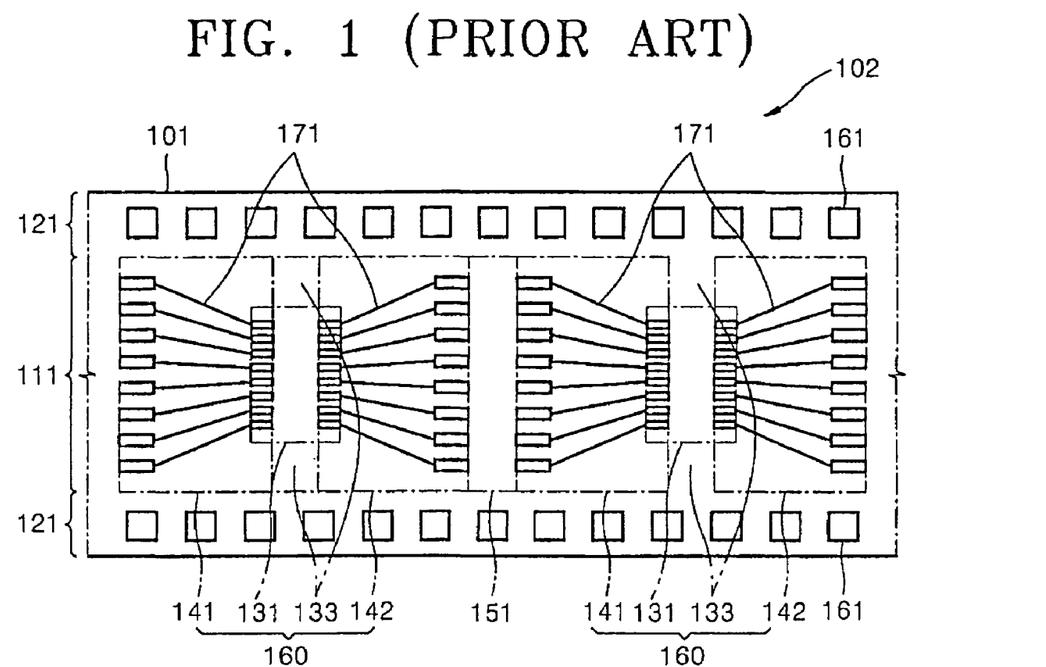
FIG. 1 is a plan view of conventional semiconductor package film.

FIG. 1 is a plan view of conventional semiconductor package film 102. Referring to FIG. 1, conventional semiconductor package film 102 includes base film 101, a main region 111, and edge regions 121.

Main region 111 includes semiconductor device regions 160. Each semiconductor device region 160 includes a semiconductor mounting region 131, to which a semiconductor chip (not shown) is mounted, and first and second metal line regions 141 and 142 that electrically connect the semiconductor chip to first and second external devices (not shown), respectively. Each semiconductor device region 160 also includes gap regions 133. A plurality of metal lines 171 is formed in each of first and second metal line regions 141 and 142. An intermediate region 151 is disposed between adjacent semiconductor device regions 160.

A plurality of sprocket holes 161 is formed in each of edge regions 121.

Figure 2:
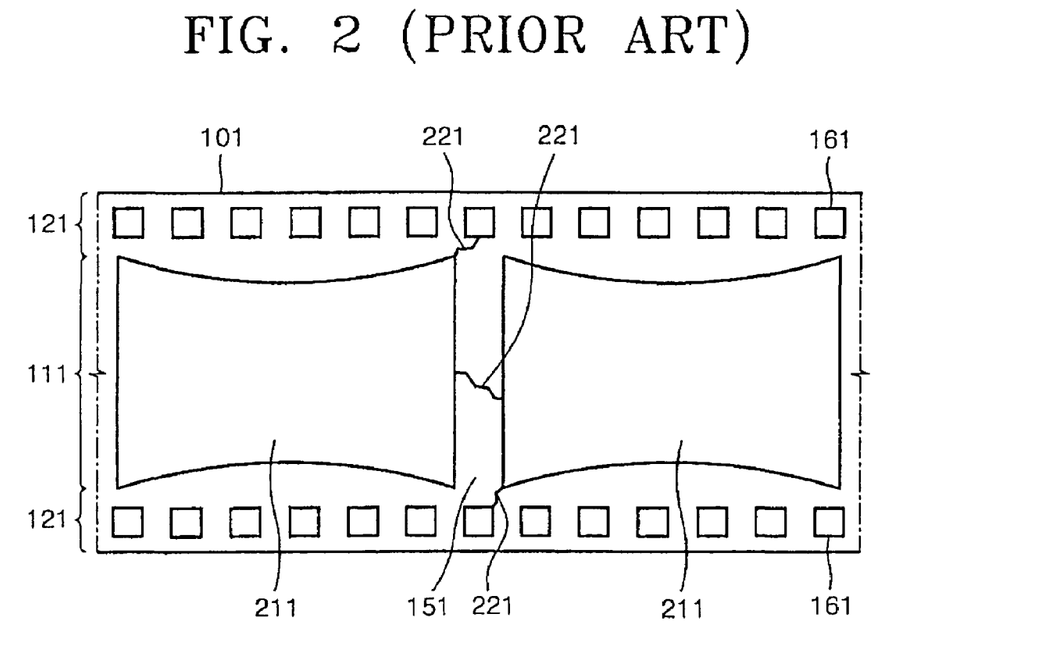
FIG. 2 is a plan view of the conventional semiconductor package film of FIG. 1, wherein an intermediate portion of the conventional semiconductor package film is torn.

FIG. 2 illustrates the conventional semiconductor package film of FIG. 1, wherein intermediate region 151 of the conventional semiconductor package film of FIG. 1 is torn. During a packaging process, semiconductor package film 102 is wound off a first reel (not shown), and then wound onto a second reel (not shown). Also during the packaging process, semiconductor device regions 160 (each including a semiconductor mounting region 131 (of FIG. 1) and first and second metal line regions 141 and 142 (of FIG. 1)) are punched out of and separated from semiconductor package film 102. After punching out semiconductor device regions 160, large holes 211 are formed where the semiconductor device regions were punched out of semiconductor package film 102. When large holes 211 are formed, the tensile strength of intermediate region 151 is reduced. Thus, holes 211 are stretched, and then intermediate region 151 may be torn out (see tears 221). When intermediate region 151 is torn out, the packaging process cannot be performed efficiently, so processing time increases and productivity in fabricating semiconductor packages decreases.

Figure 3:
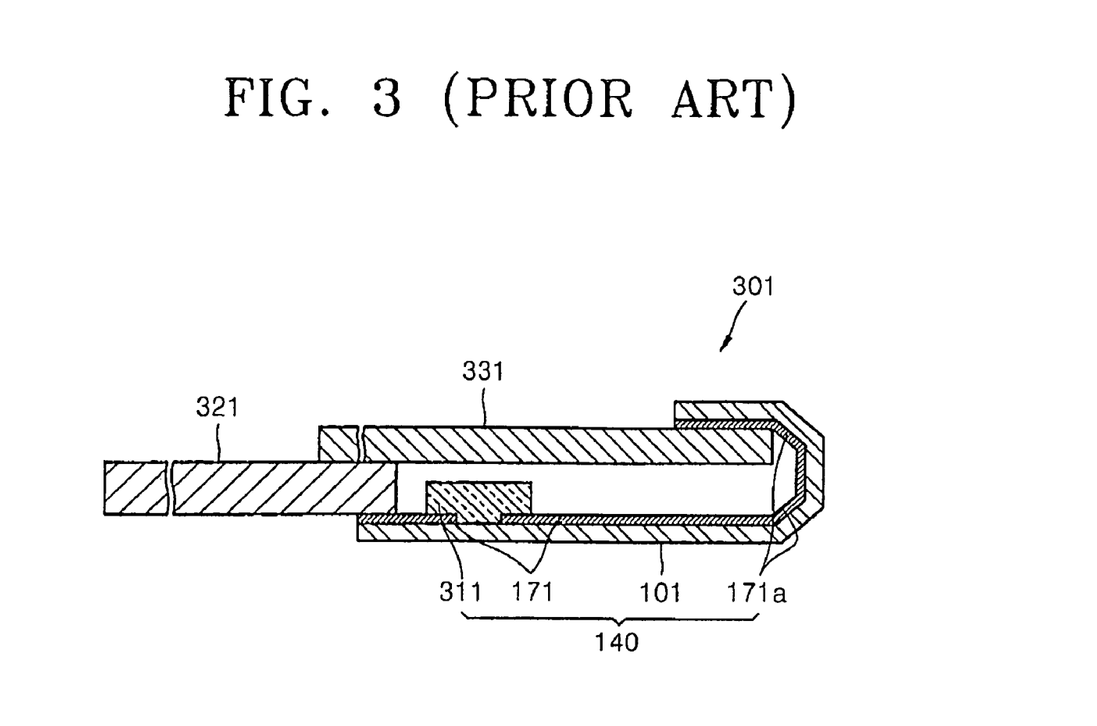
FIG. 3 is a side view of a display module including a packaged semiconductor device formed from the semiconductor package film of FIG. 1.

FIG. 3 is a side view of a display module 301 including a packaged semiconductor device 140 formed from semiconductor package film 102 of FIG. 1. In order to use a portion of semiconductor package film 102 in display module 301, a semiconductor chip 311 is mounted in a selected semiconductor device region 160 of semiconductor package film 102, and the selected semiconductor device region 160 is then punched from semiconductor package film 102. Then, a display device 321 is connected to a first end of packaged semiconductor device 140, and a circuit board 331, on which a plurality of semiconductor devices are mounted, is connected to a second end of packaged semiconductor device 140. In the configuration described above, circuit board 331 overlaps display device 321 in order to reduce the size of display module 301; and thus, packaged semiconductor device 140 is bent 180°, as illustrated in FIG. 3.

When packaged semiconductor device 140 is bent 180°, as illustrated in FIG. 3, bent portions 171a of metal lines 171 may be broken.

Figure 4:
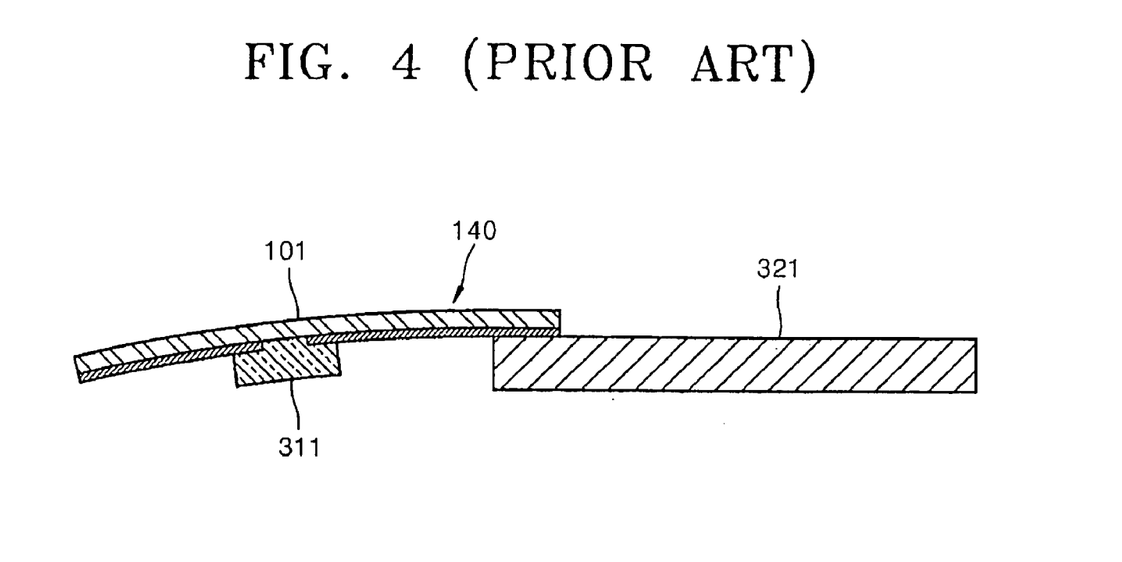
FIG. 4 is a side view of a display device to which a packaged semiconductor device is connected.

FIG. 4 is a side view of display device 321 to which packaged semiconductor device 140 is connected. In order to use packaged semiconductor device 140 in display module 301 (of FIG. 3), a first end of package semiconductor device 140 is first connected to display device 321. When the first end of packaged semiconductor device 140 is connected to display device 321 and the second end of packaged semiconductor device 140 is not connected to circuit board 331 (of FIG. 3), the second end of packaged semiconductor device 140 may readily curve. That is, the second end of packaged semiconductor device 140 may curve downward because of its own weight, or packaged semiconductor device 140 may curve in an undesired direction as a result of an external force.

When the packaging process is performed while the second end of packaged semiconductor device 140 is curved, the curved portion of packaged semiconductor device 140 may interfere with the other devices; and thus, the packaging process may not be performed efficiently.

SUMMARY OF THE INVENTION

Embodiments of the invention provide a semiconductor package film adapted to prevent intermediate portions between semiconductor device regions from being torn after punching out semiconductor device regions from the film; and provide a semiconductor package film from which a packaged semiconductor device is formed, wherein the packaged semiconductor device is adapted to be used in a display module while substantially preventing curved portions of metal lines of the packaged semiconductor device from breaking.

Embodiments of the invention also provide a semiconductor package film from which a packaged semiconductor device is formed, wherein an end portion of the packaged semiconductor device does not substantially curve during a packaging process; and provide a display module comprising a packaged semiconductor device in accordance with an embodiment of the present invention.

In one embodiment, the invention provides a semiconductor package film comprising a base film comprising a plurality of semiconductor device regions, an intermediate region disposed on a first surface of the base film and disposed between two semiconductor device regions, and a reinforcing member attached to a second surface of the base film opposite the first surface of the base film and attached opposite the intermediate region. Each semiconductor device region comprises a semiconductor mounting region adapted to receive a semiconductor chip; and first and second metal line regions, wherein the first and second metal line regions each partially overlap the semiconductor mounting region, the first metal line region comprises a first plurality of metal lines adapted to electrically connect the semiconductor chip to a first external apparatus, and the second metal line region comprises a second plurality of metal lines adapted to electrically connect the semiconductor chip to a second external apparatus.

In another embodiment, the invention provides a semiconductor package film comprising a base film. The base film comprises a semiconductor mounting region adapted to receive a semiconductor chip; and first and second metal line regions, wherein the first and second metal line regions each partially overlap the semiconductor mounting region, the first metal line region comprises a first plurality of metal lines adapted to electrically connect the semiconductor chip to a first external apparatus, and the second metal line region comprises a second plurality of metal lines adapted to electrically connect the semiconductor chip to a second external apparatus. The semiconductor package film further comprises a reinforcing member attached to a second surface of the base film and opposite a portion of the second metal line region, wherein the second surface is opposite the first surface.

In yet another embodiment, the invention provides a semiconductor package film comprising a base film comprising a semiconductor device region. The semiconductor device region comprises a semiconductor mounting region adapted to receive a semiconductor chip; and first and second metal line regions, wherein the first and second metal line regions each partially overlap the semiconductor mounting region, the first metal line region comprises a first plurality of metal lines adapted to electrically connect the semiconductor chip to a first external apparatus, and the second metal line region comprises a second plurality of metal lines adapted to electrically connect the semiconductor chip to a second external apparatus. The semiconductor package film further comprises a reinforcing member attached to a second surface of the base film, attached opposite the first and second metal line regions, and extending from a portion of the second surface opposite the first metal line region to a portion of the second surface opposite the second metal line region, wherein the second surface is opposite the first surface.

In still another embodiment, the invention provides a display module comprising base film adapted to bend; a plurality of metal lines formed on a first surface of the base film; a semiconductor chip mounted on the base film and connected to inner leads of the plurality of metal lines; a circuit board connected to outer leads of the plurality of metal lines; and a reinforcing member attached to a second surface opposite the first surface of the base film, wherein, when the base film is bent, portions of the metal lines are bent and the reinforcing member is attached to a portion of the second surface opposite at least one bent portion of the metal lines.

BRIEF DESCRIPTION OF THE DRAWINGS

Embodiments of the invention will be described with reference to the accompanying drawings, in which like reference symbols refer to like elements throughout. In the drawings.

DESCRIPTION OF EMBODIMENTS

Figure 5A:
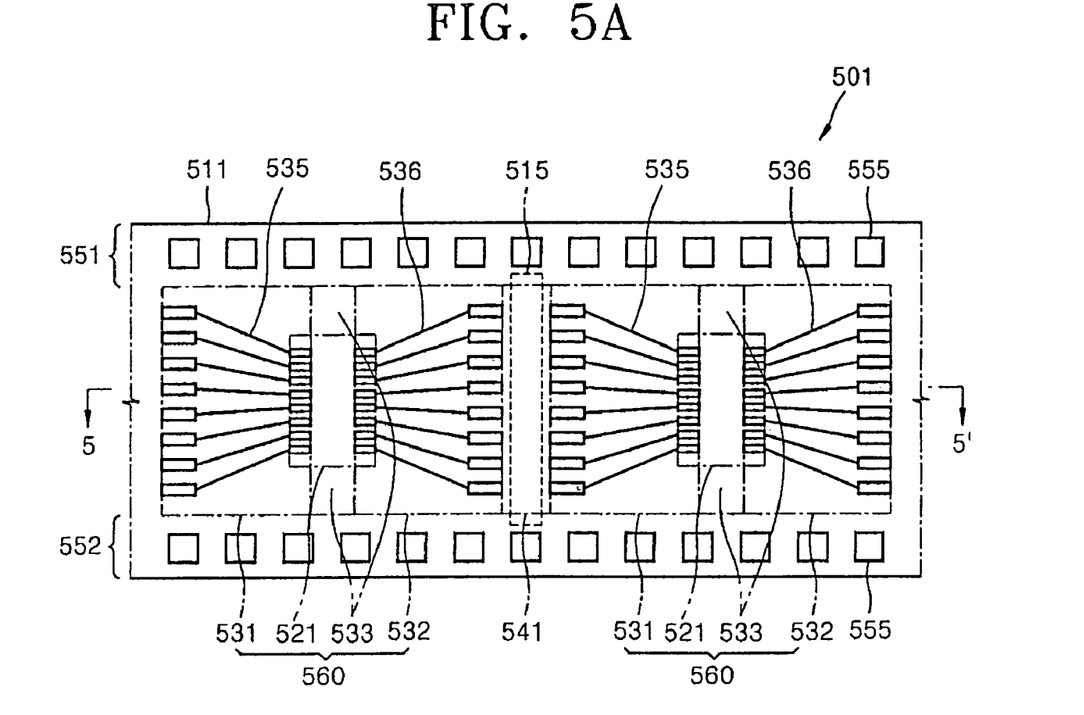
FIG. 5A is a plan view of semiconductor package film in accordance with an embodiment of the present invention.
Figure 5B:
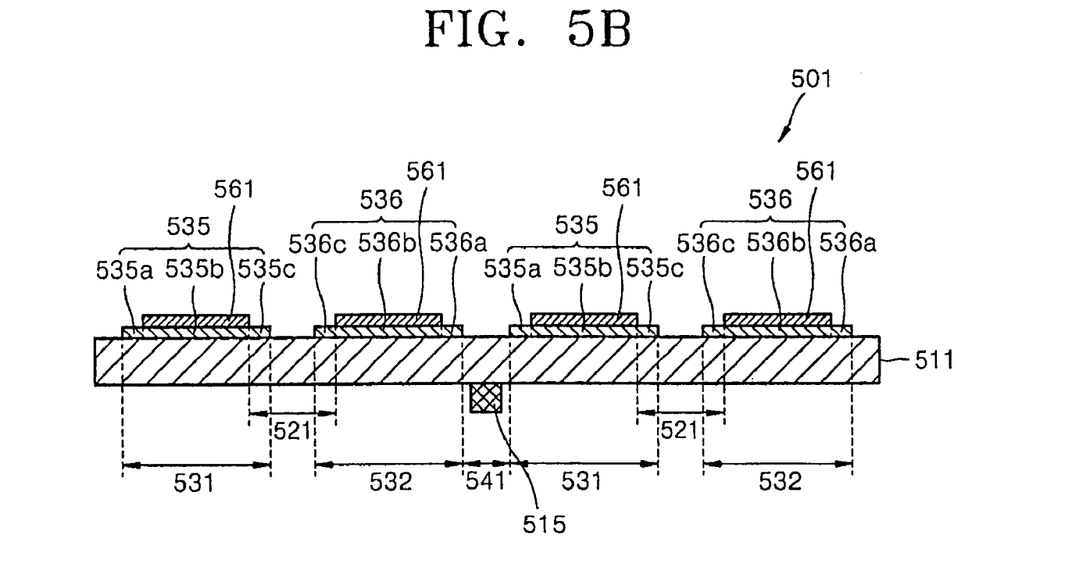
FIG. 5B is a cross-sectional view of the semiconductor package film of FIG. 5A taken along a line 5-5' of FIG. 5A.

FIG. 5A is a plan view of semiconductor package film 501 in accordance with an embodiment of the invention, and FIG. 5B is a cross-sectional view of semiconductor package film 501 of FIG. 5A taken along a line 5-5' of FIG. 5A. Referring to FIGS. 5A and 5B, semiconductor package film 501 comprises base film 511 and reinforcing members 515 (though only one reinforcing member 515 is shown in FIGS. 5A and 5B).

Base film 511 comprises semiconductor device regions 560, intermediate regions 541 (though only one intermediate region 541 is shown in FIGS. 5A and 5B), and edge regions 551 and 552. Each of semiconductor device regions 560 comprises a semiconductor mounting region 521, first and second metal line regions 531 and 532, and gap regions 533. Base film 511 is formed from a plastic material. For example, base film 511 may be formed from polyimide, liquid crystal polymer (LCP), or polyethertherketone (PEEK). The thickness of base film 511 is about 25 to 50 μm, and may be 38 μm.

Figure 6A:
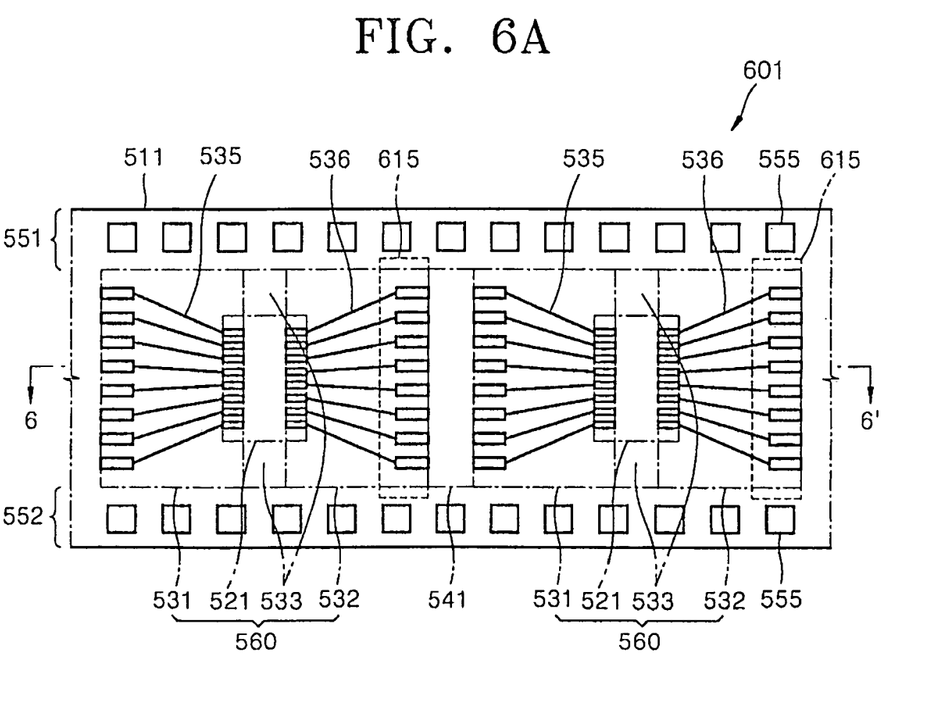
FIG. 6A is a plan view of semiconductor package film in accordance with another embodiment of the invention.
Figure 6B:
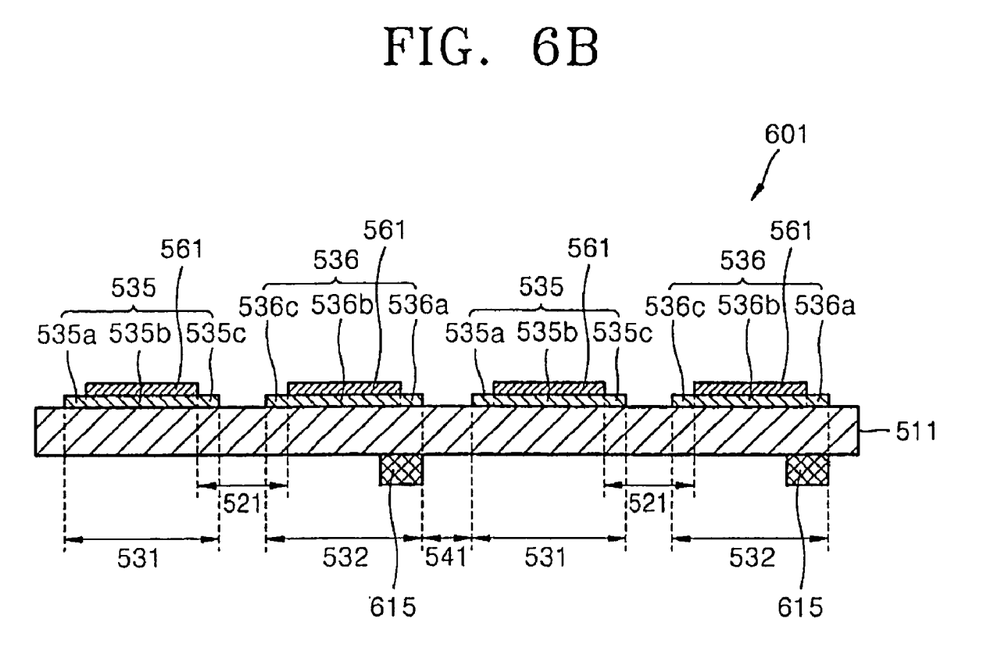
FIG. 6B is a cross-sectional view of the semiconductor package film of FIG. 6A taken along a line 6-6' of FIG. 6A.
Figure 6C:
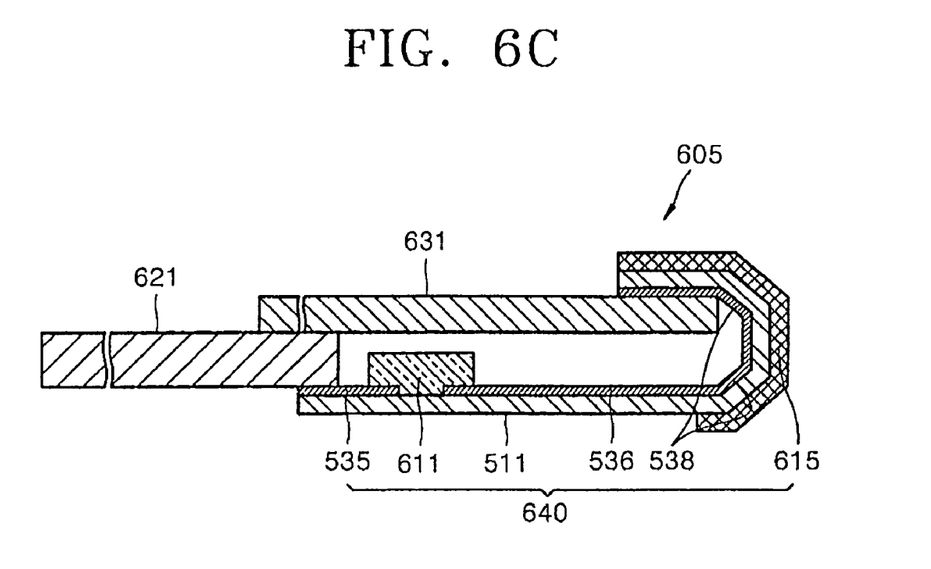
FIG. 6C is a side view of a display module comprising a packaged semiconductor device punched from a semiconductor device region of the semiconductor package film of FIGS. 6A and 6B.

Each of semiconductor mounting regions 521 is adapted to receive a semiconductor chip 611 (of FIG. 6C).

In each semiconductor device region 560, first and second metal line regions 531 and 532 of semiconductor device region 560 overlap semiconductor mounting region 521 of semiconductor device region 560, first metal line region 531 comprises a first plurality of metal lines 535, and second metal line region 532 comprises a second plurality of metal lines 536. Metal lines 535 of semiconductor device region 560 are adapted to connect to a display device 621 (of FIG. 6C) and are disposed on first metal line region 531, and metal lines 536 of semiconductor device region 560 are adapted to connect to a circuit board 631 (of FIG. 6C) and are disposed on second metal line region 532. Each metal line 535 comprises an inner lead 535c adapted to connect to semiconductor chip 611 (of FIG. 6C), an outer lead 535a adapted to connect to display device 621 (of FIG. 6C), and an intermediate metal line 535b adapted to connect inner lead 535c to outer lead 535a. Likewise, each metal line 536 comprises an inner lead 536c adapted to connect to semiconductor chip 611 (of FIG. 6C), an outer lead 536a adapted to connect to circuit board 631 (of FIG. 6C), and an intermediate metal line 536b adapted to connect inner lead 536c to outer lead 536a. Inner leads 535c and 536c are exposed in order to be connected to semiconductor chip 611 (of FIG. 6C). Also, outer leads 535a are exposed in order to be connected to display device 621, and outer leads 536a are exposed in order to be connected to circuit board 631.

Additionally, an insulating layer 561 is formed on intermediate metal lines 535b and 536b to prevent intermediate metal lines 535b and 536b from oxidizing and to protect intermediate metal lines 535b and 536b from external shock. Insulating layer 561 may be formed from a solder resist or similar material. Metal lines 535 and 536 are formed from a metal material having high electric conductivity such as, for example, copper (Cu), aluminum (Al), or silver (Ag). Metal lines 535 and 536 are formed in a predetermined pattern, and the pattern is formed through a process comprising forming a metal layer on base film 511, applying a photosensitive medium such as photoresist to the metal layer, developing the photoresist, and etching the photoresist.

Intermediate regions 541 are disposed between metal line regions 531 and 532 of adjacent semiconductor device regions 560, that is, between adjacent semiconductor device regions 560.

Semiconductor device regions 560 (each comprising a semiconductor mounting region 521 and metal line regions 531 and 532) and intermediate regions 541 are disposed on a first surface (i.e., a front surface) of base film 511.

In addition, processing sprocket holes 555 are formed in edge portions 551 and 552. Processing sprocket holes 555 formed in edge portion 551 are separated from one another such that there is a predetermined distance between adjacent processing sprocket holes 555. Likewise, processing sprocket holes 555 formed in edge portion 552 are separated from one another such that there is a distance equal to the predetermined distance between adjacent processing sprocket holes 555. As used herein, a "first dimension" is the dimension along which semiconductor device regions 560 are separated from one another, and a "second dimension" is the dimension orthogonal to the first dimension and disposed on or substantially parallel to the first surface of base film 511.

Reinforcing members 515 are attached to a second surface opposite the first surface of base film 511 (i.e., attached to a rear surface of base film 511), and are each attached opposite an intermediate region 541 to reinforce the tensile strength of intermediate region 541. In addition, reinforcing members 515 do not overlap with first and second metal line regions 531 and 532. Reinforcing members 515 are attached to base film 511 using an adhesive agent such as, for example, an acryl-based adhesive or an epoxy-based adhesive. Reinforcing members 515 may be formed from a flexible plastic material, or a similar "soft" material or a hard material (i.e., non-flexible).

As described above, when reinforcing members 515 are attached to the second surface of base film 511 opposite intermediate regions 541, respectively, the tensile strength of each intermediate region 541 can be reinforced, which may prevent each intermediate region 541 from being torn. That is, when performing the packaging process for fabricating display module 605 (of FIG. 6C), semiconductor package film 501 is wound off a first reel (not shown), semiconductor device regions 560 (each comprising a semiconductor mounting region 521 and first and second metal line regions 531 and 532) are punched out of semiconductor package film 501, one at a time, and thus separated from semiconductor package film 501, and semiconductor package film 501, from which semiconductor device regions 560 have been punched, is then wound onto a second reel (not shown). After punching out semiconductor device regions 560, the tensile strength of intermediate regions 541 may be weakened; and thus, intermediate regions 541 may be broken. However, the intermediate regions 541 may not break in a semiconductor package film 501 in accordance with an embodiment of the invention since reinforcing members 515 reinforce the tensile strength of intermediate regions 541. Therefore, the semiconductor packaging process may be performed more efficiently, and the productivity of the semiconductor packaging process can be improved.

Figure 5C:
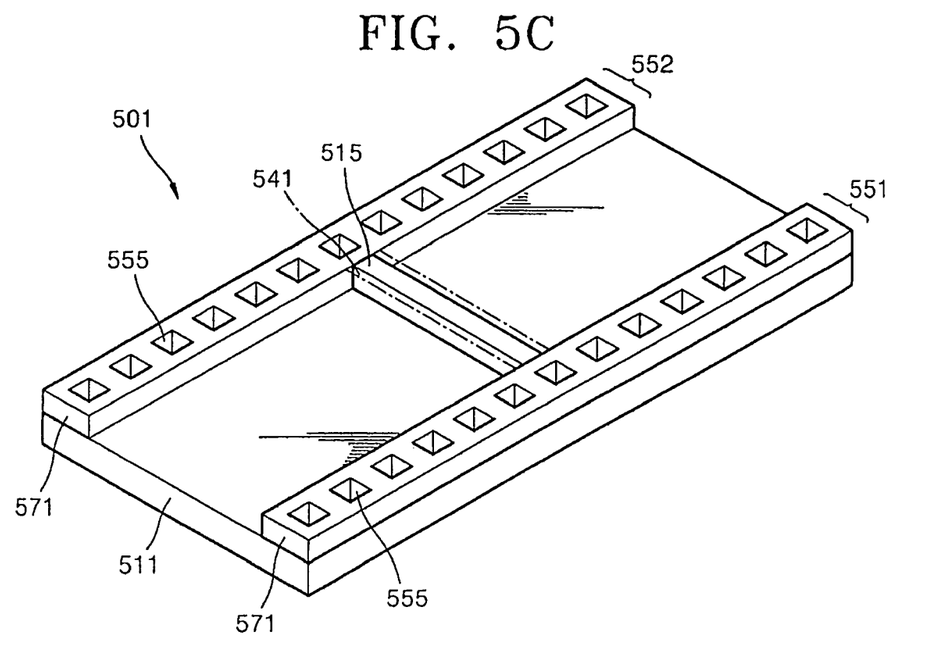
FIG. 5C is a perspective view of the semiconductor package film of FIGS. 5A and 5B showing a reinforcing member attached to a second surface thereof.

FIG. 5C is a perspective view of semiconductor packaging film 501 of FIGS. 5A and 5B showing a reinforcing member 515 attached to the second surface of semiconductor package film 501. Referring to FIG. 5C, edge reinforcing members 571 are disposed on portions of the second surface of semiconductor packaging film 501 that correspond to edge regions 551 and 552. Reinforcing members 515 may be connected to edge reinforcing members 571 (only one reinforcing member 515 is shown in FIG. 5C). Structures of edge reinforcing members 571 and a method for fabricating edge reinforcing members 571 are disclosed in Korean Laid-open Patent No. 10-2004-0010101, the subject matter of which is hereby incorporated by reference, so detailed descriptions of those structures and that method are omitted here.

When reinforcing members 515 are connected to edge reinforcing members 571, as shown in FIG. 5C, the tensile strength of intermediate regions 541 can be reinforced more than when they are not connected, so intermediate regions 541 may be prevented from being torn.

Alternatively, reinforcing members 515 may be separated from the edges of reinforcing members 571. However, even when reinforcing members 515 are separated from the edges of reinforcing members 571, the reinforcing efficiency of reinforcing members 515 is similar to the reinforcing efficiency of the reinforcing members 515 when reinforcing members 515 are connected to edge reinforcing members 571, as in the preceding example.

FIG. 6A is a plan view of semiconductor package film 601 in accordance with an embodiment of the invention, and FIG. 6B is a cross-sectional view of semiconductor package film 601 taken along a line 6-6' of FIG. 6A. Referring to FIGS. 6A and 6B, semiconductor package film 601 comprises base film 511 and reinforcing members 615.

Base film 511 is the same as base film 511 of FIGS. 5A and 5B, so further description of base film 511 is omitted here.

Reinforcing members 615 are attached to the second surface of base film 511 at portions opposite metal line regions 532. That is, reinforcing members 615 overlap some portions of metal lines 536, which are adapted to connect to circuit board 631 (of FIG. 6C).

FIG. 6C illustrates a display module 605 comprising a packaged semiconductor device 640 punched from a semiconductor device region 560 of semiconductor package film 601 of FIGS. 6A and 6B. Referring to FIG. 6C, display module 605 comprises packaged semiconductor device 640, display device 621, and circuit board 631. Display device 621 may be a liquid crystal display (LCD) or a plasma display panel (PDP). Circuit board 631 comprises semiconductor circuits adapted to control operations of display device 621.

When display module 605 comprises packaged semiconductor device 640, metal lines 536 are connected to circuit board 631 and are bent 180° to reduce the size of display module 605. Then, reinforcing member 615 is formed on the second side of base film 511 opposite bent portions 538 of metal lines 536 (i.e., reinforcing member 615 covers bent portions 538 of metal lines 536).

As described above, since reinforcing member 615 is formed opposite the entire bent portion of metal lines 536 (which comprises bent portions 538), metal lines 536 are substantially prevented from being broken where they are bent.

Figure 7A:
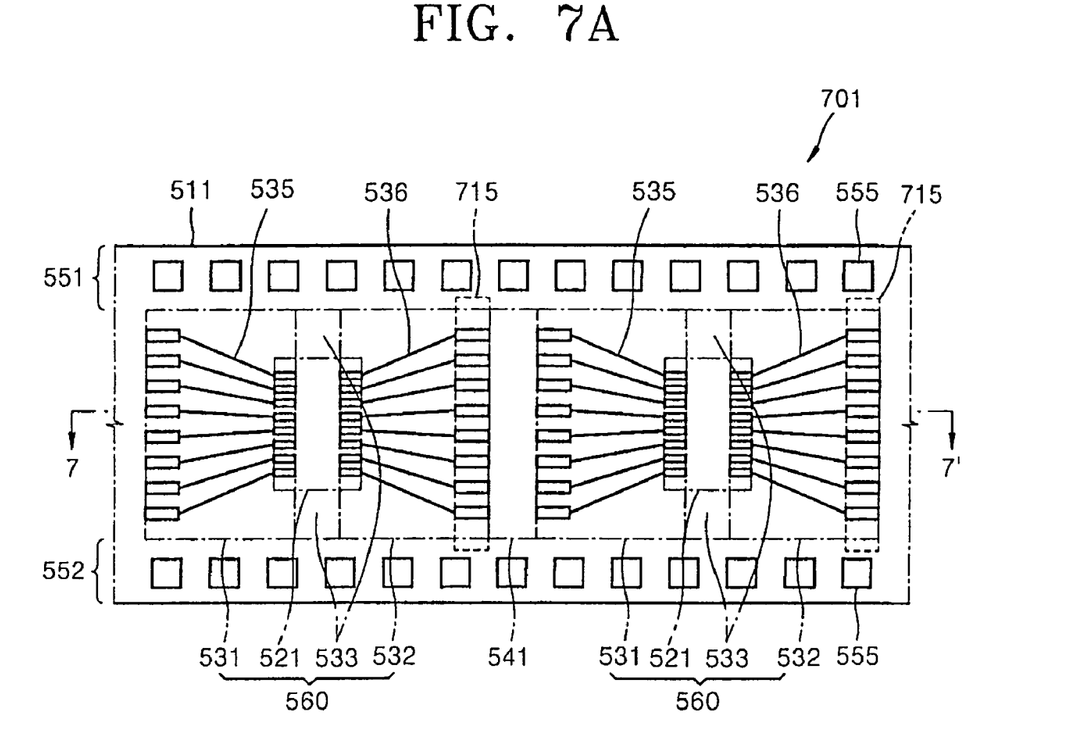
FIG. 7A is a plan view of semiconductor package film in accordance with yet another embodiment of the invention.
Figure 7B:
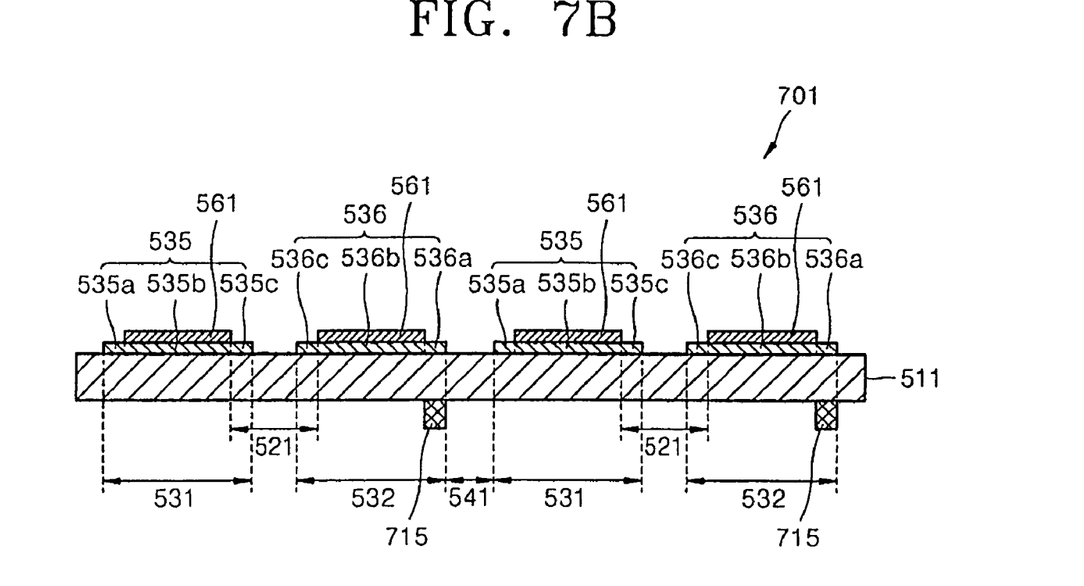
FIG. 7B is a cross-sectional view of the semiconductor package film of FIG. 7A taken along a line 7-7' of FIG. 7A.

FIG. 7A is a plan view of semiconductor package 701 in accordance with an embodiment of the invention, and FIG. 7B is a cross-sectional view of semiconductor package film 701 taken along a line 7-7' of FIG. 7A. Referring to FIGS. 7A and 7B, semiconductor package film 701 comprises base film 511 and reinforcing members 715.

Base film 511 is the same as base film 511 of FIGS. 5A and 5B, so further description of base film 511 is omitted here.

Reinforcing members 715 are respectively attached to the second surface of base film 511 at portions of the second surface of base film 511 opposite outer leads 536a of second metal line regions 532. That is, reinforcing members 715 overlap outer leads 536a, which are adapted to connect to circuit board 631 (of FIG. 7C).

Figure 7C:
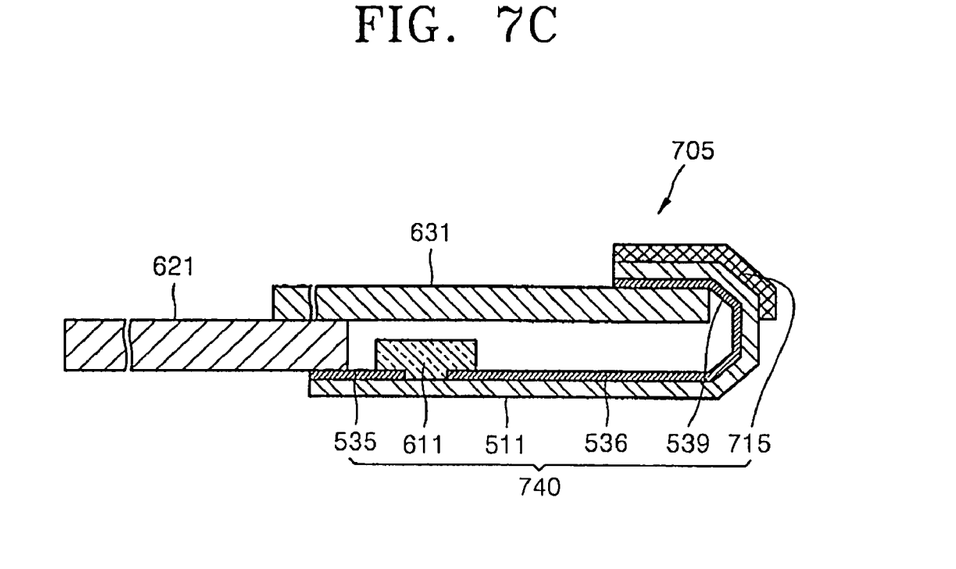
FIG. 7C is a side view of a display module comprising a packaged semiconductor device punched from a semiconductor device region of the semiconductor package film of FIGS. 7A and 7B.

FIG. 7C illustrates a display module 705 comprising a packaged semiconductor device 740 punched from a semiconductor device region 560 of semiconductor package film 701 of FIGS. 7A and 7B. Referring to FIG. 7C, when display module 705 comprises packaged semiconductor device 740, metal lines 536 are bent 180°. When metal lines 536 are bent 180°, reinforcing member 715 is formed on a second surface of base film 511 opposite bent portions 539 of outer leads 536a (i.e., reinforcing member 715 covers bent portions 539 of outer leads 536a) of metal lines 536.

As described above, since reinforcing member 715 covers bent portions 539 of outer leads 536a, outer leads 536a are substantially prevented from being broken.

Figure 8A:
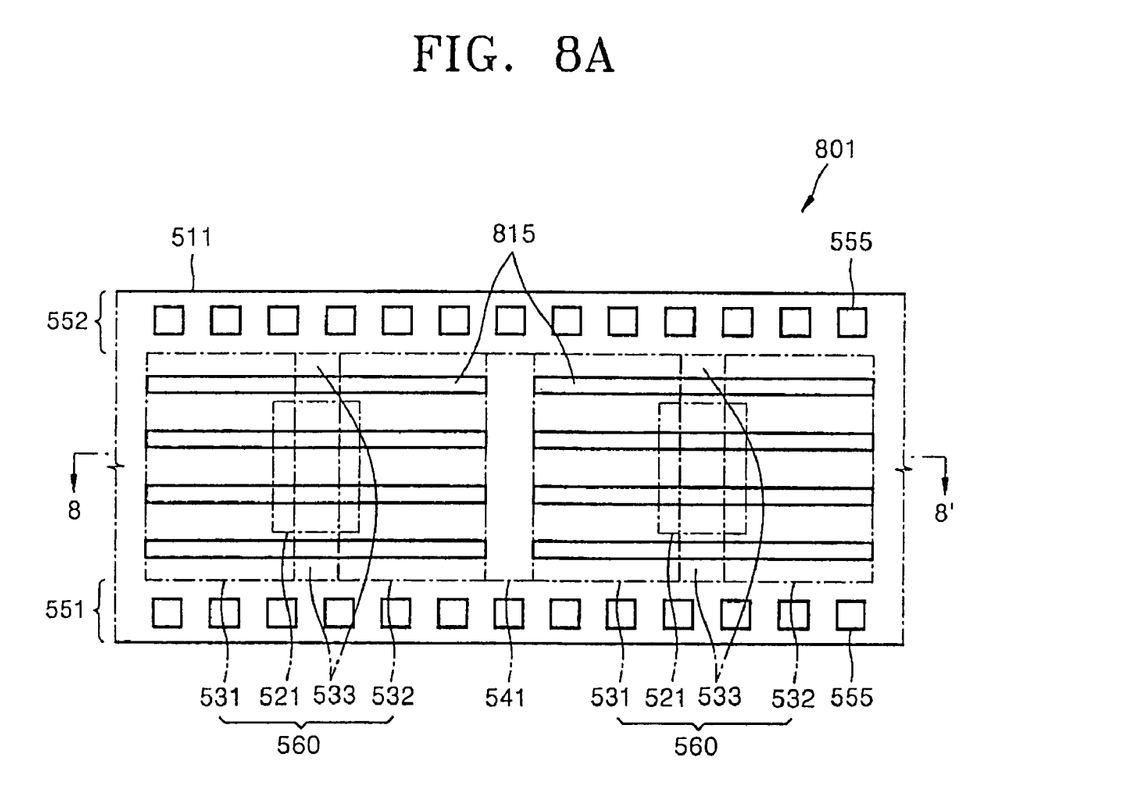
FIG. 8A is a rear view of semiconductor package film in accordance with still another embodiment of the invention.
Figure 8B:
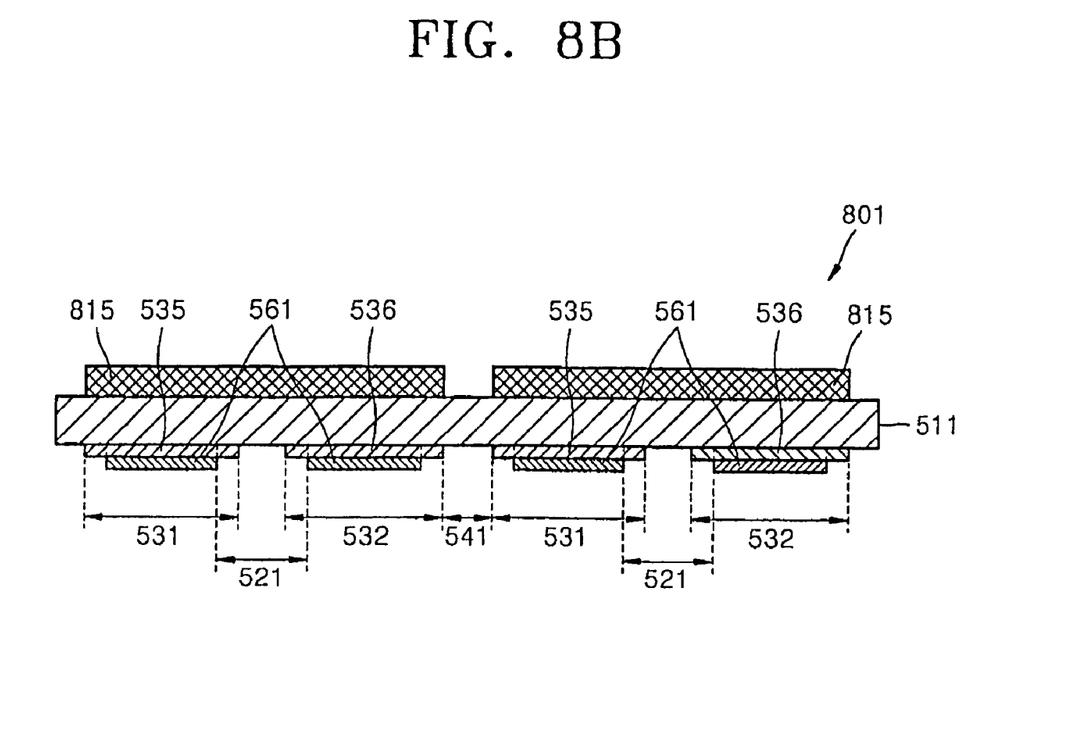
FIG. 8B is a cross-sectional view of the semiconductor package film of FIG. 8A taken along a line 8-8' of FIG. 8A; and, FIG. 8C is a side view of a packaged semiconductor device connected to a display device during a packaging process, wherein the packaged semiconductor device was punched from a semiconductor device region of the semiconductor package film of FIGS. 8A and 8B.

FIG. 8A is a rear view of a semiconductor package film 801 in accordance with an embodiment of the invention, and FIG. 8B is a cross-sectional view of semiconductor package film 801 taken along a line 8-8' of FIG. 8A. Referring to FIGS. 8A and 8B, semiconductor package film 801 comprises base film 511 and reinforcing members 815.

Base film 511 is the same as base film 511 of FIGS. 5A and 5B, so further description of base film 511 is omitted here.

Reinforcing members 815 are attached to the second surface of base film 511 and attached opposite semiconductor device regions 560 of base film 511 (wherein each semiconductor device region 560 comprises a semiconductor mounting region 521 and first and second metal line regions 531 and 532). Reinforcing members 815 are each formed having a relatively long length along the first dimension and a relatively small length along the second dimension. That is, each reinforcing member 815 extends from a portion of the second surface opposite a first metal line region 531 to a portion of the second surface opposite a second metal line region 532.

Since reinforcing members 815 are attached to base film 511, reinforcing members 815 may support base film 511 along the first dimension, and the curving of base film 511 may be reduced as a result.

Figure 8C:
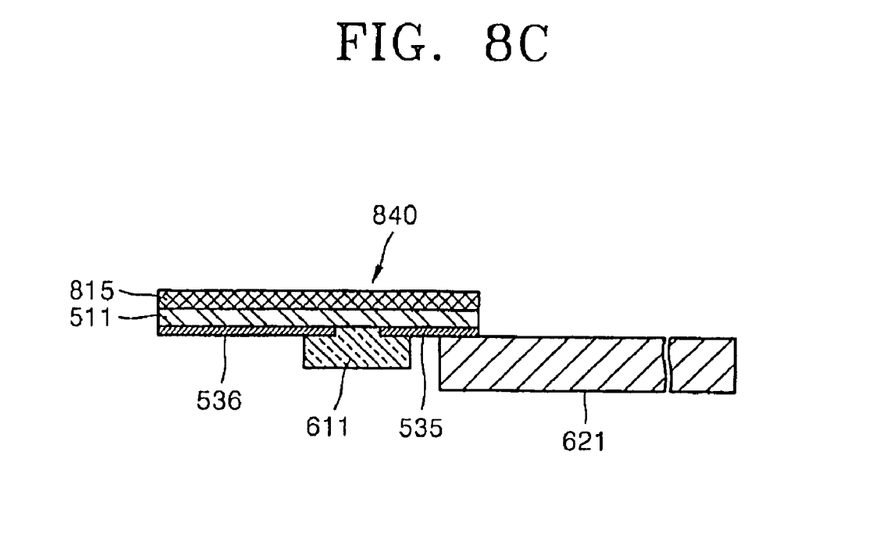

FIG. 8C illustrates a packaged semiconductor device 840 connected to display device 621 during the packaging process, wherein packaged semiconductor device 840 was punched from semiconductor device region 560 of semiconductor package film 801 of FIGS. 8A and 8B. Referring to FIG. 8C, even when a first end of packaged semiconductor device 840 is connected to display device 621 and a second end of packaged semiconductor device 840 is not connected to circuit board 631 (of FIG. 7C), reinforcing members 815 substantially prevent package semiconductor device 840 from curving downward.

Thus, even though the first end of packaged semiconductor device 840 is connected to display device 621 while the second end is not connected to circuit board 631 (of FIG. 7C) during the packaging process, packaged semiconductor device 840 does not interfere with operations of the other devices. Therefore, the packaging process can be performed efficiently, and accordingly, the productivity of the semiconductor packaging process can be improved.

As described above, when reinforcing members 515 are attached to base film 511, intermediate regions 541 disposed between adjacent semiconductor device regions 560 may not be torn. In addition, when reinforcing members 615 are attached to base film 511, bent portions 538 of second metal lines 532 may not be broken when display module 605 is fabricated, and when reinforcing members 715 are attached to base film 511, bent portions 539 of outer leads 532a of second metal lines 532 may not be broken when display module 705 is fabricated. Also, even when only one end portion of packaged semiconductor device 840 is connected to display device 621 or circuit board 631 during the packaging process, packaged semiconductor device 840 may not curve downward.

Therefore, the process for fabricating display module 605, 705, or 805 using semiconductor package film 501, 601, 701, or 801 can be performed with high efficiency.

While the invention has been shown and described with reference to embodiments thereof, it will be understood by those of ordinary skill in the art that various changes in form and detail may be made therein without departing from the scope of the invention as defined by the accompanying claims.

What is claimed is:

1. A semiconductor package film comprising:
 a base film comprising:
 a plurality of semiconductor device regions, wherein each semiconductor device region comprises:
  a semiconductor mounting region adapted to receive a semiconductor chip; and
  first and second metal line regions, wherein the first and second metal line regions each partially overlap the semiconductor mounting region, the first metal line region comprises a first plurality of metal lines adapted to electrically connect the semiconductor chip to a first external apparatus, and the second metal line region comprises a second plurality of metal lines adapted to electrically connect the semiconductor chip to a second external apparatus;
 an intermediate region disposed on a first surface of the base film and disposed between two of the semiconductor device regions;
 edge regions disposed at opposite ends of the intermediate region; and
 a reinforcing member attached to a second surface of the base film opposite the first surface of the base film and attached opposite the intermediate region and disposed perpendicularly to the edge regions, and wherein a length of the reinforcing member along a first dimension is less than a length of the intermediate region along the first dimension.

2. The film of claim 1 wherein the length of the reinforcing member along a second dimension orthogonal to the first dimension is greater than the length of the intermediate region along the second dimension.

3. The film of claim 1, wherein the base film further comprises:
first and second edge regions, wherein each of first and second edge regions comprises a plurality of processing sprocket holes;
first and second edge reinforcing members attached respectively to the first and second edge regions; and,
the reinforcing member is connected to the first and second edge reinforcing members.

4. The film of claim 1, wherein:
the base film further comprises first and second edges regions;
each of first and second edge regions comprises a plurality of processing sprocket holes;
first and second edge reinforcing members are attached to the first and second edge regions, respectively; and,
the reinforcing member is separated from each of the first and second edge reinforcing members.

5. The film of claim 1, wherein the reinforcing member is formed from a flexible material.

6. The film of claim 1, wherein the reinforcing member is formed from a non-flexible material.

* * * * *